(12) United States Patent
Sonsky et al.

(10) Patent No.: US 7,919,364 B2
(45) Date of Patent: Apr. 5, 2011

(54) SEMICONDUCTOR DEVICES AND METHODS OF MANUFACTURE THEREOF

(75) Inventors: Jan Sonsky, Leuven (BE); Gerben Doornbos, Kessel-Lo (BE)

(73) Assignee: NXP B.V., Eindhoven (NL)

( * ) Notice: Subject to any disclaimer, the term of this patent is extended or adjusted under 35 U.S.C. 154(b) by 310 days.

(21) Appl. No.: 12/307,800

(22) PCT Filed: Jul. 9, 2007

(86) PCT No.: PCT/IB2007/052698
§ 371 (c)(1),
(2), (4) Date: Jan. 7, 2009

(87) PCT Pub. No.: WO2008/007331
PCT Pub. Date: Jan. 17, 2008

(65) Prior Publication Data
US 2009/0209092 A1 Aug. 20, 2009

(30) Foreign Application Priority Data
Jul. 11, 2006 (EP) .................................... 06116968

(51) Int. Cl.
*H01L 21/332* (2006.01)
(52) U.S. Cl. ........................................ 438/135; 257/213
(58) Field of Classification Search .................. 438/135; 257/213–413
See application file for complete search history.

(56) References Cited

U.S. PATENT DOCUMENTS

| | | |
|---|---|---|
| 6,348,409 B1 | 2/2002 | Shih |
| 6,756,643 B1 | 6/2004 | Achuthan et al. |
| 6,787,402 B1 | 9/2004 | Yu |
| 6,853,020 B1 | 2/2005 | Yu et al. |
| 6,855,582 B1 | 2/2005 | Dakshina-Murthy et al. |
| 2004/0048424 A1 | 3/2004 | Wu et al. |
| 2004/0253775 A1 | 12/2004 | Achuthan et al. |
| 2005/0040444 A1* | 2/2005 | Cohen ........................... 257/288 |
| 2005/0077550 A1 | 4/2005 | Inaba et al. |
| 2005/0148137 A1 | 7/2005 | Brask et al. |
| 2005/0199919 A1 | 9/2005 | Liu et al. |
| 2005/0272190 A1 | 12/2005 | Lee et al. |
| 2006/0068550 A1 | 3/2006 | Chang et al. |

OTHER PUBLICATIONS

Liu, Y X, et al; "4-Terminal_FinFETs with High Threshold Voltage Controllability"; Device Research Conference, 2004 62nd DRC. Conference Digest (Late News Papers Volume Included) Notre Dame, IN, USA; Jun. 21-23, 2004; Piscataway, NJ, USA; IEEE pp. 207-208; XP010748217; ISBN: 0-7803-8284-6.

Liu, Y X, et al; "Advanced FinFET Technology: Tin Metal-Gate CMOS and 3T/4T Device Integration"; SOI Conference, 2005; Proceedings; 2005 IEEE International Honolulu, HI, USA; Oct. 3-6, 2005, Piscataway, NJ, USA; IEEE; pp. 217-220; XP010866689; ISBN: 0-7803-9212-4.

* cited by examiner

*Primary Examiner* — Thanh V Pham
*Assistant Examiner* — Tony Tran

(57) ABSTRACT

A FinFET and methods for its manufacture are provided. The method of the invention provides an elegant process for manufacturing FinFETs with separated gates. It is compatible with a wide range of dielectric materials and gate electrode materials, providing that the gate electrode material(s) can be deposited conformally. Provision of at least one upstanding structure (or "dummy fin") (40) on each side of the fin (4) serves to locally increase the thickness of the gate electrode material layer (70). In particular, as the shortest distance between each upstanding structure (40) and the respective side of the fin (4) is arranged in accordance with the invention to be less than twice the thickness of the conformal layer, the thickness of the gate electrode material layer (70) all the way across this distance between each upstanding structure (40) and the fin (4) is increased relative to that over planar regions of the substrate (2). Thus, following an anisotropic etch to remove gate electrode material (70) overlying the fin (4), some material nevertheless remains between the upstanding structures and the fin. Thus, an enlarged area of gate electrode material is formed for use as a gate contact pad.

10 Claims, 7 Drawing Sheets

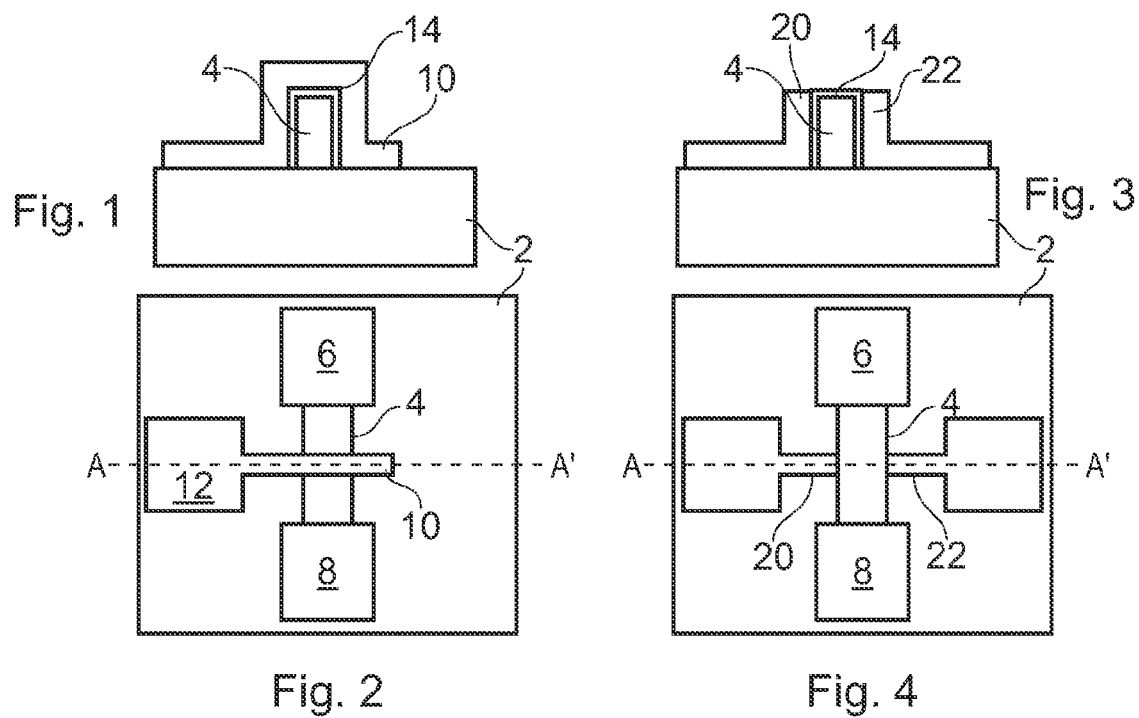
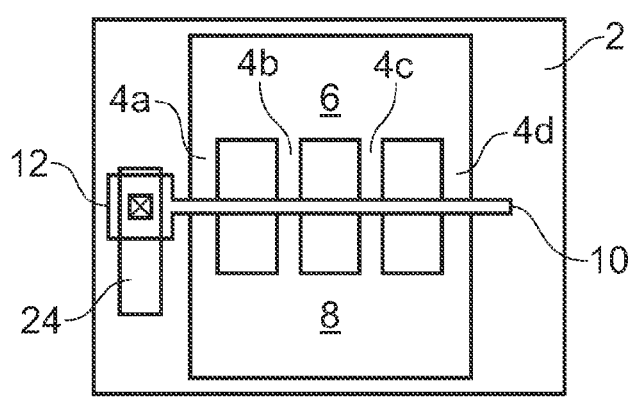

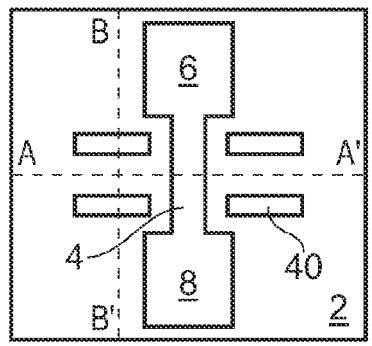 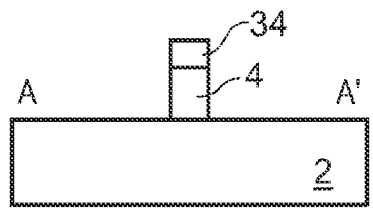 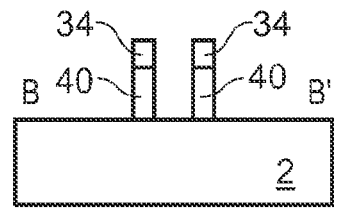
Fig. 10　　　　　Fig. 11　　　　　Fig. 12
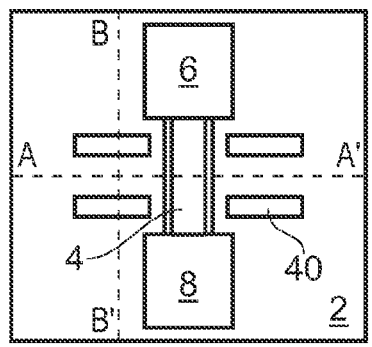 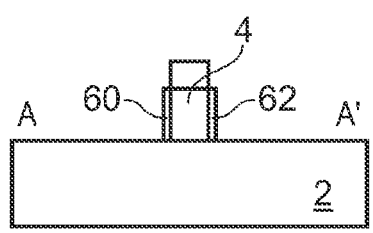 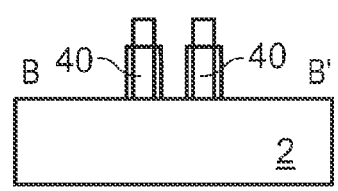
Fig. 13　　　　　Fig. 14　　　　　Fig. 15
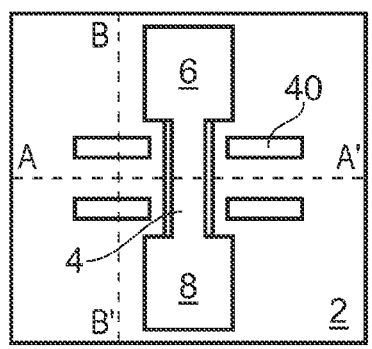 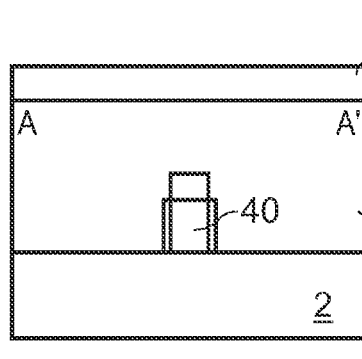 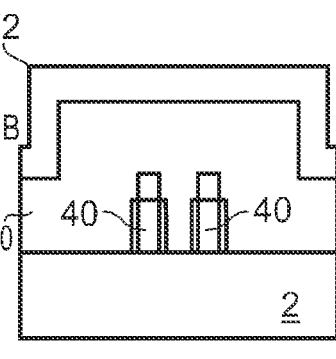
Fig. 16　　　　　Fig. 17　　　　　Fig. 18

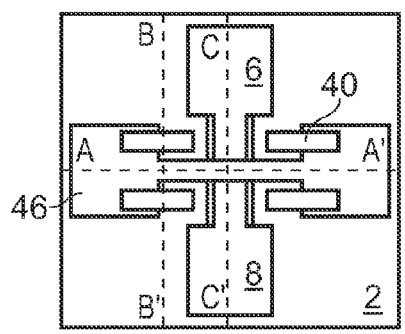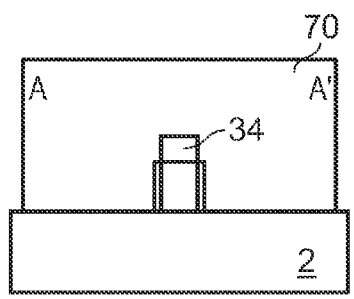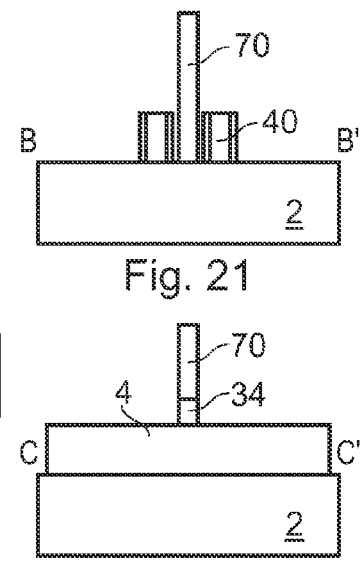
Fig. 19     Fig. 20     Fig. 21
Fig. 22
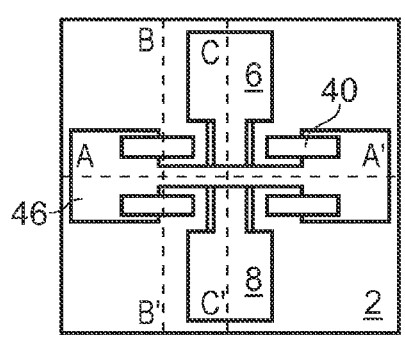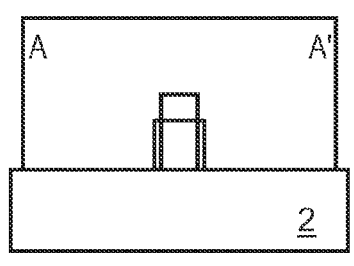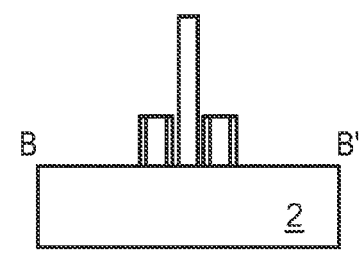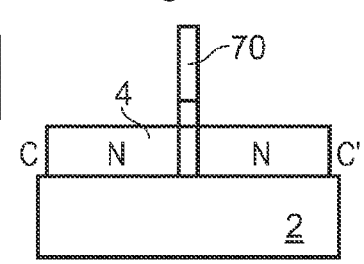
Fig. 23     Fig. 24     Fig. 25
Fig. 26

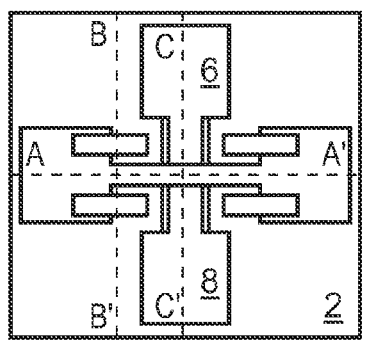
Fig. 27
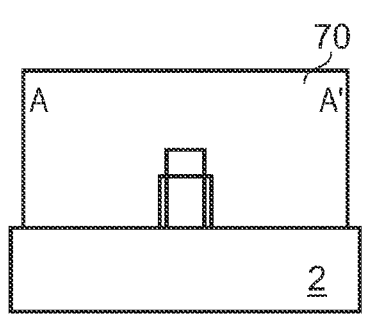
Fig. 28
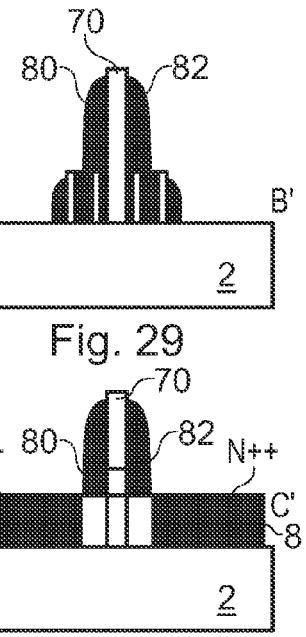
Fig. 29
Fig. 30
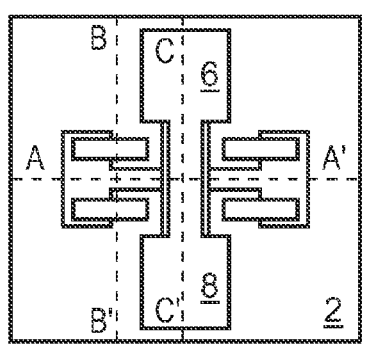
Fig. 31
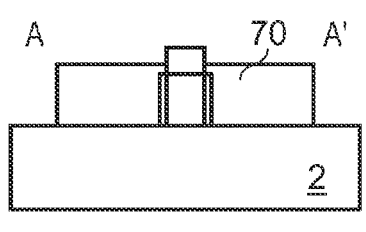
Fig. 32
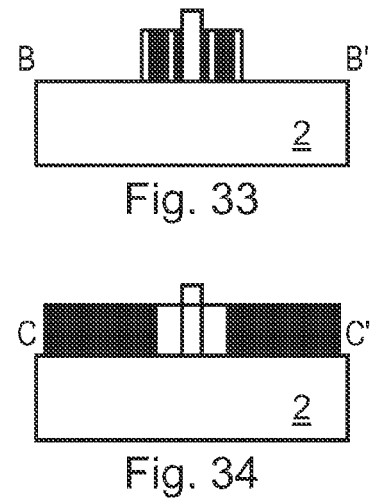
Fig. 33
Fig. 34

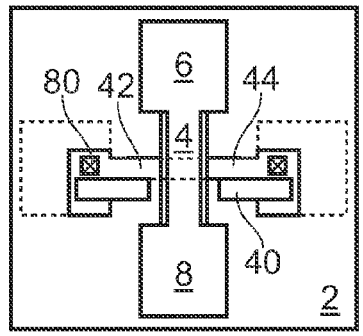 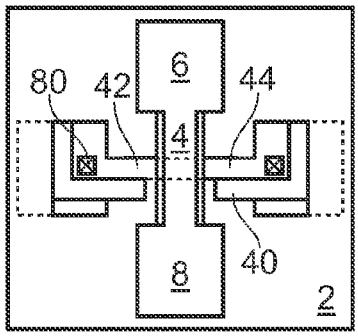 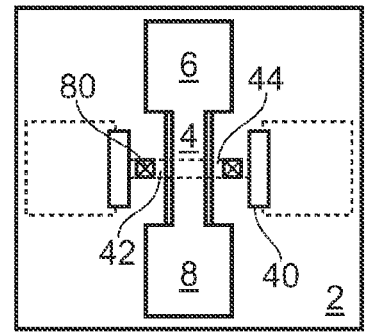
Fig. 37　　　　Fig. 38　　　　Fig. 39
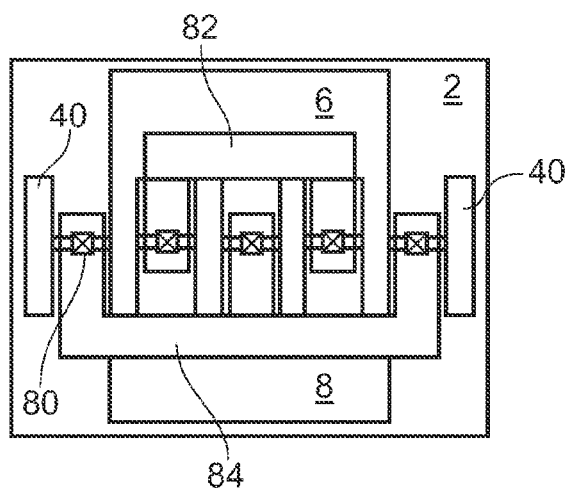
Fig. 40

SEMICONDUCTOR DEVICES AND METHODS OF MANUFACTURE THEREOF

This invention relates to semiconductor devices and methods for manufacturing such devices. In particular, it relates to insulated-gate field-effect transistors having short gate lengths.

There is a continual desire to increase the density of semiconductor devices in integrated circuits which therefore requires reduction in the dimensions of such devices. However, when the gate length of conventional devices is reduced to below around 100 nm, problems associated with short channel effects, such as excessive leakage between the source and drain, are encountered.

A structure that has been developed to allow further reduction in the dimensions of devices is the FinFET form of metal oxide semiconductor field-effect transistor (MOSFET).

FIGS. 1 and 2 show cross-sectional and plan views, respectively, of a known FinFET. The cross-section of FIG. 1 is taken along line A-A' marked in FIG. 2. The FinFET is formed on an insulating substrate 2 and includes an elongate upstanding structure or fin 4 formed of semiconducting material extending between source and drain regions 6, 8. The gate 10, typically formed of polysilicon, extends around three sides of the vertical fin 4 from a gate contact pad 12. It is separated from the fin by a gate dielectric layer 14, formed of silicon dioxide, for example. Provision of a gate wrapped around three sides of the fin provides good channel charge control, even at short gate lengths, to an extent not possible in planar single gate transistors.

Many IC applications designed in existing planar CMOS processes use channel (or back-gate) biasing to control the threshold voltage of transistors. This possibility is not available with the FinFET configuration shown in FIGS. 1 and 2.

Threshold voltage adjustment can be achieved with a FinFET by splitting its gate into two separately biased gates on each side of the fin. A device of this type is illustrated in FIGS. 3 and 4, which show views of its structure corresponding to those of FIGS. 1 and 2.

A first gate 20 extends vertically over one sidewall of the fin 4, and a second gate 22 extends vertically over the other sidewall. One of the gates can be used to switch the transistor and drive current, whilst the other is used for threshold voltage adjustment or another function. Existing approaches to form the separate gates involve depositing gate dielectric material and then gate electrode material over the top of a fin and then use of a planarisation process to remove gate electrode material overlying the fin. Examples of FinFET fabrication techniques involving this approach are disclosed in U.S. Pat. No. 6,853,020, U.S. Pat. No. 6,756,643, U.S. Pat. No. 6,787,402, and US 2005/0040444.

In view of the small dimensions of FinFETs, the use of planarisation to separate the gates requires very careful process control to ensure that the gates are separated without impinging on the fin itself. A drawback with some planarisation techniques is that they do not allow fabrication of FinFETs with separated gates on the same substrate as FinFETs with a continuous gate.

FIG. 5 shows a plan view of a known FinFET having a continuous gate 10 and multiple fins 4a to 4d. A gate electrode 24 contacting the gate contact pad 12 is also shown. Inclusion of multiple fins increases the effective channel width of the device in order to achieve a desired drive current capability.

The present invention provides a method of manufacturing a semiconductor device, including the steps of:
  (a) providing a substrate having an insulating top surface;
  (b) forming a fin of semiconductor material on the top surface of the substrate, the fin having first and second opposite sides;
  (c) forming at least one upstanding structure on each side of the fin laterally spaced from the respective side of the fin;
  (d) depositing a conformal layer of gate electrode material;
  (e) patterning the layer of gate electrode material; and
  (f) anisotropically etching away gate electrode material until the gate electrode material adjacent the first side of the fin is separated from the gate electrode material on the second side of the fin, the shortest distance between each upstanding structure and the respective side of the fin being less than twice the thickness of the conformal layer deposited in step (d).

In particular, the finished device may be a FinFET including source and drain regions defined at opposite ends of the fin. Application of a voltage signal to one of the two separate gates in the on-state of the device serves in a known manner for inducing a conduction channel in the fin and for controlling current flow in this channel between the source and drain regions.

The method of the invention provides an elegant process for manufacturing FinFETs with separated gates. It is compatible with a wide range of dielectric materials and gate electrode materials, providing that the gate electrode material(s) can be deposited conformally.

Provision of at least one upstanding structure (or "dummy fin") on each side of the fin serves to locally increase the thickness of the gate electrode material layer. In particular, as the shortest distance between each upstanding structure and the respective site of the fin is less than twice the thickness of the conformal layer, the thickness of the gate electrode material layer all the way across this distance between each upstanding structure and the fin is increased relative to that over planar regions of the substrate. Thus, following an anisotropic etch to remove gate electrode material overlying the fin, some material nevertheless remains between the upstanding structures and the fin. Thus, an enlarged area of gate electrode material is formed for use as a gate contact pad.

In the absence of the upstanding structures, an anisotropic etch (or "spacer etch") could be used to separate the gates, but it would also remove the gate electrode material from all planar surfaces, resulting in isolated gate spacers to which metal electrodes could not be readily connected. This is illustrated in FIGS. 6 and 7 (FIG. 7 being a cross-sectional view along line A-A' marked in FIG. 6). Isolated gate spacers 30 and 32 are shown adjacent opposite sides of the fin 4. The hard mask 34 used to pattern semiconductor material to form the fin 4 is also shown.

A method embodying the invention may be implemented using only one additional processing step relative to a sequence of steps for forming a known FinFET configuration, such as shown in FIGS. 1 and 2, thereby minimising the cost implications of the process.

The method steps noted above include a step (e) of patterning the layer of gate electrode material. In this way, the width of the gates and the shape of the gate contact pads is defined. It will be appreciated that this step may be carried out before or after the step of anisotropically etching away gate electrode material to separate the gates on either side of the fin (step (f) above).

In a device including two or more fins extending alongside each other, one fin may effectively act as or define an upstanding structure in accordance with the method of the invention in relation to another, adjacent fin. Thus, in fabricating a device having multiple adjacent fins according to an embodiment of the invention, additional, free-standing or "dummy fins", need only be provided adjacent the outer sides of the outermost fins if the multiple fins are close enough together.

Where an upstanding structure is provided as an additional structure, rather than by another fin of the device for example, it is preferably in the form of an island of inactive material. That is, it takes no part in the operation of the device when it is active. Conveniently, the island of material may be formed of semiconducting material deposited in the same layer as the fin and patterned in the same process step as the fin.

In some preferred embodiments, at least two upstanding structures are provided laterally spaced from each side of the fin. At least one upstanding structure may be L-shaped in plan view, that is when viewed in a direction perpendicular to the plane of the substrate.

A wide variety of gate electrode materials may be used alone or in combination, providing that they are capable of being deposited conformally. In a preferred embodiment, the conformally deposited layer of gate material comprises a layer of polycrystalline semiconductor material over a metallic layer. Other materials which may be used for this purpose include amorphous silicon, titanium nitride, tantalum nitride, molybdenum, or other metallic materials that can be deposited using conformal methods such as atomic layer chemical vapour deposition ("ALD"). Fully silicided polysilicon ("FUSi") gates may also be formed by depositing on polysilicon a metal layer such as platinum or nickel of sufficient thickness to fully transform the polysilicon layer into metal silicide during a subsequent annealing process. Such a silicidation process would preferably be carried out after formation of the source and drain regions.

According to a further embodiment of the invention, a FinFET having a continuous gate may be formed simultaneously on the same substrate as a FinFET having separated gates by masking the gate electrode material over the fin of the former device during the step of anisotropically etching away gate electrode material so that a continuous region of gate electrode material remains which extends from one side of the fin to the other.

Known device configurations and processes, and embodiments of the invention are described herein by way of example and with reference to the accompanying schematic drawings, wherein:

FIGS. 1 and 2 are cross-sectional and plan views, respectively, of a known FinFET with a continuous gate;

FIGS. 3 and 4 are cross-sectional and plan views, respectively, of a known FinFET with separate gates;

FIG. 5 is a plan view of a known FinFET having multiple fins and a continuous gate;

FIGS. 10 to 34 are plan and cross-sectional views of a semiconductor device at successive stages in its manufacture according to one example of a method embodying the present invention;

FIGS. 37 to 39 are plan views of FinFETs according to different embodiments of the invention; and FIG. 40 is a plan view of a FinFET having multiple fins according to a further embodiment of the invention.

Figure 6:
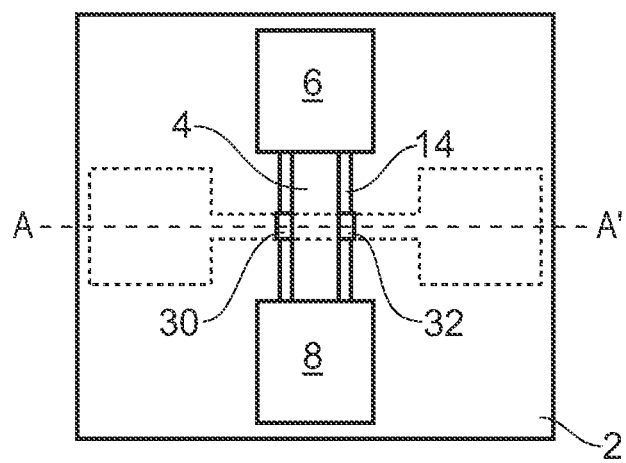
FIGS. 6 and 7 are plan and cross-sectional views, respectively, of a FinFET with isolated gate spacers.
Figure 7:
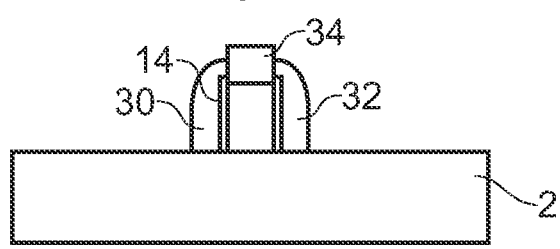

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

Figure 8:
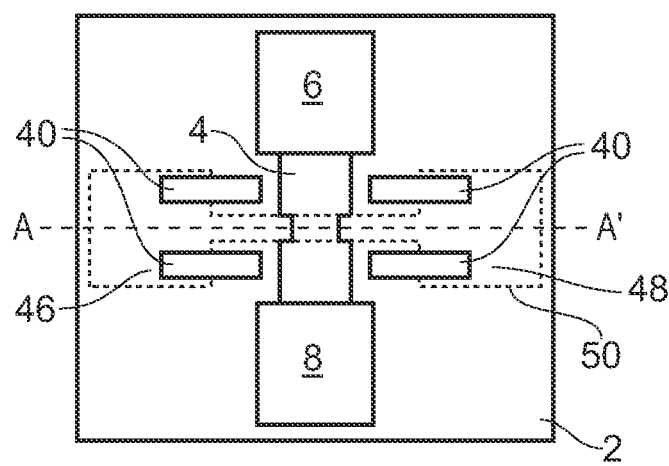
FIGS. 8 and 9 are plan and cross-sectional views, respectively, of a FinFET at an intermediate stage in a process of manufacture according to an embodiment of the invention.
Figure 9:
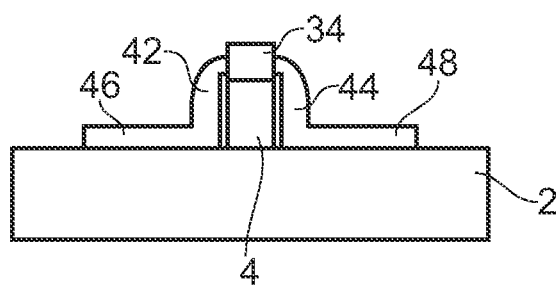

FIG. 8 shows a plan view of a FinFET structure manufactured in accordance with an embodiment of the invention, and FIG. 9 is a cross-sectional view taken along line A-A' marked in FIG. 8. The device is shown at an intermediate state in its manufacture, after the gate electrode material has been patterned and anisotropically etched. Each gate comprises a spacer portion 42, 44 and a contact portion 46, 48, respectively. The presence of a pair of upstanding structures or "dummy fins" on either side of the semiconductor device fin 4 results in the gate electrode material remaining after the anisotropic etch extending away from the gate spacers 42, 44 to a region between the upstanding structures of each pair to form the contact portions 46, 48. The dotted line 50 denotes the shape of the mask used to pattern the gate electrode material.

Steps in a process for manufacturing a device having the configuration shown in FIGS. 8 and 9 will now be described with reference to FIGS. 10 to 34. FIGS. 10, 13, 16, 19, 23, 27 and 31 are plan views of each stage and the Figures alongside illustrate cross-sectional views along lines marked in the corresponding plan views.

The substrate used is a silicon-on-insulator (SOI) structure, comprising a silicon substrate (not shown), a buried oxide layer 2, and a monocrystalline silicon layer on the buried oxide layer. The buried oxide layer 2 may be formed of a silicon oxide, such as silicon dioxide, and have a thickness of about 100 to 500 nm. Preferably, this layer is about 150 nm thick. The overlying silicon layer is monocrystalline and about 20 to 200 nm thick. Preferably, it is about 60 nm thick. It will be appreciated that the silicon layer may comprise other semiconducting materials, such as germanium, or combinations of semiconductor materials, such as silicon-germanium. Buried oxide layer 2 may also be formed of dielectric materials other than silicon oxide.

Optionally, a dielectric layer, formed of silicon nitride or silicon oxide for example, may be formed over the upper silicon layer to act as a protective cap during subsequent etching processes. A mask 34 is provided by patterning a uniform layer of a suitable material in a conventional manner. It may be formed of silicon dioxide, silicon nitride, SiON or SiOC, for example, and about 40 nm thick.

As shown in FIGS. 10 to 12, the upper silicon layer is etched away at windows defined by the mask 34 using a suitable conventional anisotropic etchant. This forms a silicon fin 4 on the oxide substrate layer 2. The fin has a cap of dielectric material remaining thereover from the mask. The mask also defines the source and drain regions 6, 8 and upstanding structures 40 in the silicon layer.

A dielectric layer is then provided over the exposed sides of the fin 4, in the form of vertical layers 60, 62 on the first and second sides of the fin, respectively. These layers may be formed for example by oxidation of the side walls of the silicon fin, or by conformal deposition of a layer of dielectric material. This stage is illustrated in FIGS. 13 to 15.

The length of the fin between the source and the drain regions 6, 8 may be in the range of 50 to 100 nm. Its width may be around 5 to 25 nm and preferably about 10 nm. In plan view, each upstanding structure 40 shown in FIG. 10 may be around 100 nm long and about 25 nm wide.

A layer 70 of gate electrode material is then deposited conformally over the substrate as shown in FIGS. 16 to 18. This layer, preferably formed of polycrystalline silicon, may be about 50 to 200 nm thick, and preferably about 100 nm thick. As can be seen in FIG. 17, the presence of the upstanding structures 40 near to the cross-sectional (gate) line A-A' results in a greater thickness of gate electrode material being formed in this plane.

A layer 72 of mask material is then deposited, which may be formed of TEOS for example. This layer is then patterned to define a mask for etching of the gate electrode material. The gate material is then etched away together with exposed remaining portions of the mask layer 34. This results in the structures shown in FIGS. 19 to 22.

An "extension" doping implant step is then carried out to dope the regions of semiconductor material which are not masked by the gate electrode material layer 70, as well as the gate material itself. The conditions for this implantation are selected to minimise spread of the implant into the channel region of the fin 4 under the gate material. The dopant may be n-type or p-type and is preferably arsenic, phosphorous or boron. It may be implanted at a dosage in the range of about $1 \times 10^{14}$ atoms/cm$^2$ to about $1 \times 10^{15}$ atoms/cm$^2$, typically around $5 \times 10^{14}$ atoms/cm$^2$, and an implantation energy of about 1 to 5 KeV (depending on the dopant used). As can be seen in FIG. 26, the fin region underneath the gate material layer 70 is undoped.

So-called pocket implants may optionally be carried out at this stage to improve short channel effects. A dopant type opposite to that of the extension implant is used at an angle to extend beyond the extension implants into the channel.

A further mask material layer is then conformally deposited and anisotropically etched to form spacers. Silicon nitride may be used for example. This forms spacers 80, 82 on either side of the gate material 70. Then a further implantation step is carried out at a greater dose than the extension implant step using a dopant of the same conductivity type. The extent of this implantation can be less tightly controlled than that of the extension implant as it is spaced from the channel region by the nitride spacers. The doped regions formed by the extension implant step extend between the heavily doped regions (denoted N++ in the Figures) of the source and drain regions 6, 8 as shown in FIGS. 27 to 30. This implant also dopes the gate material.

The spacers 80, 82 may then be etched away. An anisotropic etch is then carried out on the gate electrode material layer 70, resulting in the structure shown in FIGS. 31 to 34.

A silicidation process may then be carried out to improve the conductivity of the gates in a known manner. Further processing is subsequently carried out to form the finished device as well known in the art.

Figure 35:
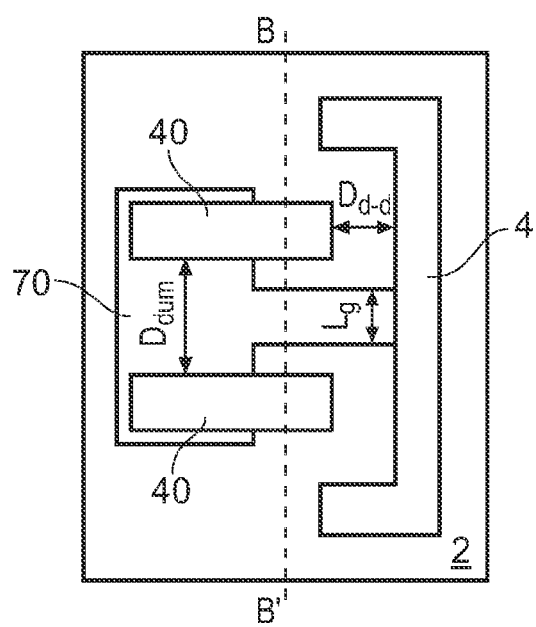
FIGS. 35 and 36 are plan and cross-sectional views illustrating the dimensions of various structures on a substrate.

It will be appreciated that, in order for the upstanding structures 40 to have the desired effect of increasing the area of material remaining after the anisotropic gate etching step, certain dimensional requirements need to be met. They will now be considered with reference to FIGS. 35 and 36. The distance between adjacent upstanding structures (Ddum) and their spacing from the device fin (Dd-d) needs to be less than twice the thickness (Tg) of the gate electrode material layer. Furthermore, the gate line (length Lg) must fall between the two upstanding structures 40. These requirements can readily be fulfilled using standard processing parameters, for example with Tg=100 nm, meaning that Ddum and Dd-d need to be less than 200 nm, and the gate needs to be aligned within a 200 nm window between the upstanding structures 40.

Figure 36:
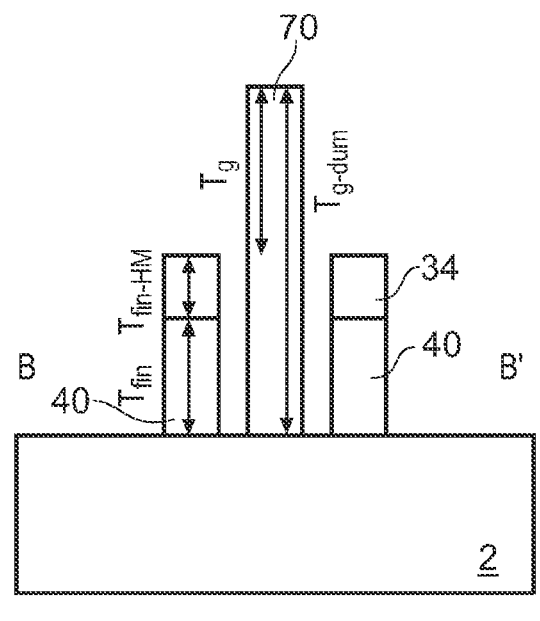

Turning to the anisotropic gate etching step, relevant parameters are marked on FIG. 36. The gate line thickness (Tg-dum) between the upstanding structures 40 is equal to the thickness of the deposited layer (Tg) plus the height of the fins (Tfin) and the height of the hard mask 34 (Tfin-HM). Under ideal conditions, the depth of gate material etched away would be equal to Tg leaving a gate line between the upstanding structures having a height equal to that of the upstanding structures together with the overlying mask 34. Allowing for etch processing tolerances, even in the case of 50% over etch, the gate lines will still be 50 nm thick if the combined height of the fins and hard mask is 100 nm.

Various modifications could be made to the manufacturing process embodiments described above. For example, the hard mask 34 could be removed after it has been used to etch the semiconductor layer. However, it is preferable to retain it as it increases the tolerance of the anisotropic gate material etching step to process variations and wafer non-uniformities.

The anisotropic gate etch could be carried out before the gate material is patterned. In that case, the mask layer 72 used to pattern the gate material could be left in place during the extension implant step and the spacers 80, 82 aligned to it.

Circuits comprising a mixture of FinFETs having continuous and separated gates could be manufactured simultaneously by masking some gate material areas extending over respective fins during the anisotropic gate etching process.

Although in the process described above, only a single material is used to form the gates, it will be appreciated that the process is compatible with the use of multi-layer gates. For example, a thin metal layer may be overlaid with a thicker polysilicon layer. In that case, the anisotropic gate etch would be carried out in two steps, etching away polysilicon material and then the exposed metal.

The configuration of upstanding structures illustrated in the above embodiment is just one possibility. It will be appreciated that a variety of configurations could be used to achieve the desired results, providing that they comply with the dimensional requirements discussed above. Some further examples are shown in FIGS. 37 to 39.

In FIGS. 37 and 39, a single elongate upstanding structure is provided adjacent each side of the fin 4. In FIG. 37, the longitudinal axis of the upstanding structure is perpendicular to the length of the fin, whilst in FIG. 39 it is parallel thereto. In the embodiment of FIG. 38, a single upstanding structure is provided on each side of the device fin which is L-shaped in plan view. Suitable locations 80 for gate contacts are marked in each of FIGS. 37 to 39.

A FinFET manufactured according to an embodiment of the invention including multiple fins is illustrated in FIG. 40. It will be appreciated that adjacent fins effectively act as upstanding structures in relation to their neighbours and additional upstanding structures are only required adjacent the outer sides of the outermost fins. Exemplary layouts of gate contact electrodes 82, 84 are also shown to illustrate how connections can be made to the separated gates.

From reading the present disclosure, other variations and modifications will be apparent to persons skilled in the art. Such variations and modifications may involve equivalent and other features which are already known in the art, and which may be used instead of or in addition to features already described herein.

For example, whilst the embodiments described above are formed on an SOI substrate, it will be appreciated that other forms of substrate could be used, including a conventional bulk semiconductor substrate.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. A method of manufacturing a semiconductor device, including the steps of:
   (a) providing a substrate having an insulating top surface;
   (b) forming a fin of semiconductor material on the top surface of the substrate, the fin having first and second opposite sides;
   (c) forming at least one upstanding structure on each side of the fin laterally spaced from the respective side of the fin;
   (d) depositing a conformal layer of gate electrode material;
   (e) patterning the layer of gate electrode material; and
   (f) anisotropically etching away gate electrode material until the gate electrode material adjacent the first side of the fin is separated from the gate electrode material on the second side of the fin, the shortest distance between each upstanding structure and the respective side of the fin being less than twice the thickness of the conformal layer deposited in step (d).

2. A method of claim 1 wherein step (f) is carried out before step (e).

3. A method of claim 1 wherein the semiconductor device includes at least one additional fin of semiconductor material and at least one of the upstanding structures is provided by the at least one additional fin.

4. A method of claim 1, wherein at least one of the upstanding structures is an island of inactive material.

5. A method of claim 4 wherein the island of material comprises semiconductor material formed from the same layer as the fin.

6. A method of claim 1, wherein the conformal layer of gate electrode material comprises a layer of polycrystalline semiconductor material over a metallic layer.

7. A method of claim 1, wherein the gate electrode material of the finished device comprises at least one of polycrystalline semiconductor material, a metal, titanium nitride, tantalum nitride and fully silicided polycrystalline semiconductor material.

8. A method of claim 1, wherein at least one additional semiconductor device having a fin is formed simultaneously on the same substrate, and gate electrode material over the fin of the at least one additional device is masked during step (f) so that the gate electrode material is continuous from one side of the fin to the other in the finished additional device.

9. A method of claim 1, wherein at least two upstanding structures are provided laterally spaced from each side of the fin.

10. A method of claim 1, wherein at least one upstanding structure is L-shaped in plan view.

* * * * *